Sept. 12, 1967 W. G. KLEHM, JR 3,341,742
CIRCUIT ASSEMBLY
Filed Feb. 18, 1965
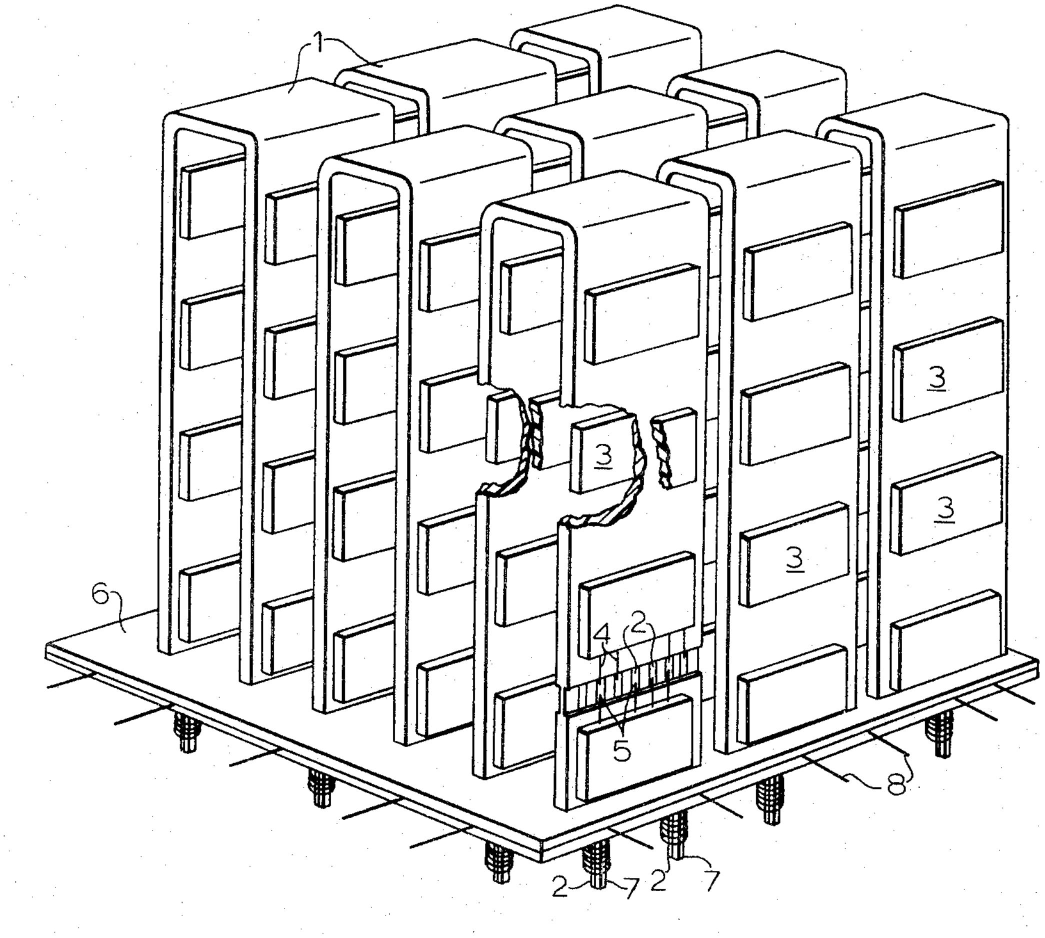
INVENTOR
WILLIAM G. KLEHM, JR.
BY Irving Weiner
AGENT 3,341,742

CIRCUIT ASSEMBLY

William G. Klehm, Jr., Farmington, Mich., assignor to Burroughs Corporation, Detroit, Mich., a corporation of Michigan

Filed Feb. 18, 1965, Ser. No. 433,687
4 Claims. (Cl. 317—101)

ABSTRACT OF THE DISCLOSURE

A circuit assembly having several U-shaped conductor-carrying flexible strips each having many electronic component packages electrically and mechanically connected thereto. Conductors extending from each flexible strip are inserted through a rigid back-plane and are wire-wrapped together with conductors in the back-plane.

This invention relates to circuit modules, and more particularly to folded, compact modules formed of circuit packages and flexible conductor strips.

Modern electronic equipment necessitates providing as much circuitry as possible in a small space or volume. One of the various packaging techniques which has come into wide use in the electronics industry is the riser pin module. The riser pin module contains several printed circuit boards stacked in parallel relation. Riser pins are disposed around the edges of the boards and crimped thereto to provide structural rigidity. Electrical connection between the printed circuit boards is made by soldering the conductors of the various boards to a common riser pin. After assembly, the riser pin package is inserted into a back-plane or a similar receptacle for the extending riser pins.

Serious disadvantages are attendant to the riser pin module. No cross-overs are permitted on an individual board. Furthermore, in order to provide electrical interconnections between the boards, the riser pins themselves must be used. When a riser pin is used for an interconnection, it is no longer available for electrical connection at the back-plane. Repair or replacement is quite difficult and time consuming. Upon completion of repairs, the module must be reassembled and reconnected to the back-plane.

The present invention overcomes these disadvantages. The present invention consists generally of flexible conductor strips and packages containing electrical components which are connected to the strips. After the component packages have been connected to the flexible strips, the strips are folded into a U-shape so that the exposed ends of the strips extend in the same direction. A plurality of folded strips are inserted into a back-plane by means of conductors extending from the folded strip. Conductors in the back-plane may be wire-wrapped together with the exposed ends of the conductors of the flexible strips.

The present invention provides a circuit module comprising a plurality of strips of electrical insulating material, wherein each strip contains a plurality of electrical conductors insulatingly embedded therein and extending longitudinally thereof. Separate electrical component packages are mounted on each strip having electrical leads extending therefrom and connected to certain of the conductors carried by the flexible strips. The flexible strips are then folded transverse to the conductors in the strips to form a U-shape, so that the component packages are stacked in parallel relation to each other.

An object of the invention is to provide an electric circuit module that is relatively compact and readily assembled or disassembled.

Another object is to provide a circuit module containing a number of replaceable units, any one of which may be readily removed for repair or replacement.

Other objects and advantages of the invention will become apparent from the following descriptions, claims and drawing in which:

The drawing shows an isometric view of an assembled circuit module containing a plurality of U-shaped subunits carrying the component packages.

Referring to the drawing, each flexible strip 1 consists of a large number of fairly stiff conductive wires 2 embedded within a covering layer of an insulating plastic. Commercially available .020" x 030" Phosphor bronze wire is satisfactory for the conductive wires 2, as it is rigid enough to permit electrical connections to be made to it while also permitting the flexible strips 1 to be folded. A suitable material for the covering layer is adhesive backed Mylar polyester film, commercially available, which possesses the necessary mechanical and electrical properties. The strip 1 must be flexible enough to permit it to be bent into various configurations and must be rigid enough to remain in a bent configuration. One technique of fabricating suitable flexible strips 1 is set forth below, it being understood that the present invention is not limited to the described materials or fabricating technique.

Fifty rolls of .020" x .030" Phosphor bronze wire 2 are positioned at one end of an aligning jig which holds the wire 2 on .050" centers. About 18" of wire 2 is drawn from each roll and placed in the aligning jig. A strip of Mylar film having an adhesive back is placed over the wires 2. The flexible cable is then removed from the jig and a similar strip of Mylar film is placed on the other side. The plastic strips are pressed together insulately sandwiching the fifty conductors 2. The strips 1 are then sheared off from the rolls.

Packages 3 contain encapsulated circuit components which are hermetically sealed units having flexible or flying leads 4 extending therefrom. Suitable flying lead packages 3 for use in the present invention, such as the Westinghouse functional electronic block package, are commercially available. These leads 4 may be joined in an appropriate way, such as by soldering or welding, to conductors 2. The plastic is first removed from the conductor strips in the region of these joints or connections 5 to make the wires accessible. This may be done by stripping the plastic away or by pre-punching the plastic strips before they are placed on the wires 2 during manufacture.

The conductors 2 of the strip 1 form the interconnections for the electronic component packages 3. After the component packages 3 have been electrically and mechanically attached to the conductors 2 of the strip 1, the flexible strip 1 bearing the packages 3 is folded into the desired configuration for mounting on a back-plane 6.

In the embodiment shown, the flexible strips 1 are bent into U-shapes so that the exposed ends of the conductors 2 of the strips 1 all face in the same direction and lie in a common plane. The appropriate exposed ends of the conductors 2 of the flexible strip 1 are wire-wrapped together with the appropriate side plane pins 7. Module pins 8 of the back-plane 6 are also shown in the drawing.

As is evident from the drawing, the flexible lead strips 1 may be folded with any desired degree of tightness, i.e., the flexible strip 1 can be folded so tightly that the flying lead electronic packages 3 are as close together as possible in a parallel relation to form a module having a very thin profile. Design considerations, such as unwanted coupling effects and cooling problems, as well as the amount of space available for mounting, determine the tightness with which the folding is to be done.

It is possible to mount the electronic packages 3 on the flexible strip 1 in any desired configuration. In the drawing, a portion of one flexible strip 1 is cut away to show that the electronic packages 3 are mounted on both sides of the flexible strip 1. The packages 3, of course, may be mounted on only one side of the strip 1 as desired.

In the embodiment shown, the flexible strips 1 are bent into U-shapes. Other configurations are possible, such as M-shapes, as long as the strips 1 are folded transverse to the plurality of parallel conductors 2 embedded in the plastic insulating material of the strips 1.

While the novel features of the invention have been described as applied to only one possible embodiment, it is understood that various changes and modifications may be made without departing from the spirit of the invention. It is the intention therefore to be limited only as indicated by the scope of the following claims.

What is claimed is:

1. A circuit module comprising one or more insulated conductor strips, each strip containing a plurality of electrical conductors insulatingly embedded therein and having the insulation removed from said strip at predetermined regions, a plurality of component packages having leads extending therefrom, said packages having their leads connected to the strip at said predetermined regions, each strip being folded into a U-shape so that said packages are arranged in parallel relation to each other, said conductors extending beyond the ends of each strip, and the ends of said conductors lying in a common plane.

2. A circuit assembly comprising, in combination:
a flat non-flexible back-plane member;
a plurality of flexible strips mounted on said flat non-flexible back-plane member;
each flexible strip having a U-shape with two parallel legs of the U being disposed perpendicular to said flat non-flexible back-plane member;
each flexible strip including a plurality of parallel conductors sandwiched between at least two layers of insulating material;
a plurality of hermetically sealed electronic component packages secured to both sides of each flexible strip;
each hermetically sealed electronic component package having leads extending therefrom which are electrically connected to predetermined conductors of said plurality of parallel conductors;
each flexible strip being arranged relative to said flat non-flexible back-plane member so that all of said hermetically sealed electronic component packages and all of said two parallel legs of the U are parallel to each other and perpendicular to said flat non-flexible back-plane member; and
the exposed ends of said plurality of parallel conductors lie in a common plane which is parallel to said flat non-flexible back-plane member.

3. A circuit assembly comprising, in combination:
a flat non-flexible back-plane member;
a plurality of flexible strips mounted on one side of said flat non-flexible back-plane member;
each flexible strip having a U-shape with two parallel legs of the U being disposed perpendicular to said flat non-flexible back-plane member;
each flexible strip including a plurality of parallel conductors sandwiched between two layers of insulating material;
a plurality of hermetically sealed electronic component packages secured to both sides of each flexible strip;
each flexible strip having said insulating material removed from said flexible strip at predetermined regions thereof;
each hermetically sealed electronic component package having leads extending therefrom which are electrically connected to predetermined conductors of said plurality of parallel conductors at said predetermined regions of said flexible strip;
each flexible strip being arranged relative to said flat non-flexible back-plane member so that all of said hermetically sealed electronic component packages and all of said two parallel legs of the U are parallel to each other and perpendicular to said flat non-flexible back-plane member;
said plurality of parallel conductors having uninsulated end portions extending beyond the edges of said flexible strip;
a plurality of conductive pins protruding from the other side of said flat non-flexible back-plane member;
a plurality of wire-wrappings electrically and mechanically connecting predetermined conductive pins to predetermined uninsulated end portions of said parallel conductors on said other side of said back-plane member; and
the exposed ends of said plurality of parallel conductors lie in a common plane which is parallel to said flat non-flexible back-plane member.

4. A circuit assembly comprising, in combination, a back-plane, a plurality of U-shaped folded flexible insulated conductor strips mounted on one side of said back-plane, each of said flexible strips including a plurality of parallelly-arranged conductors embedded within an insulating material so that each conductor is insulated from the other conductors, a plurality of electronic component packages electrically and physically connected to predetermined conductors of said plurality of conductors of a flexible strip, a plurality of conductive pins protruding from the other side of said back-plane, and a plurality of wire-wrappings electrically and mechanically connecting predetermined conductive pins to predetermined conductors of a flexible strip on said other side of said back-plane.

References Cited

UNITED STATES PATENTS

| | | | |
|---|---|---|---|
| 2,997,521 | 8/1961 | Dahlgren | 174—68.5 |
| 3,152,288 | 10/1964 | Mittler | 317—101 |
| 3,242,384 | 3/1966 | Klehm | 317—101 |

OTHER REFERENCES

Electronics, June 21, 1963, page 84.

ROBERT K. SCHAEFER, *Primary Examiner.*

W. C. GARVERT, J. R. SCOTT, *Assistant Examiners.*